United States Patent [19]

Tajima et al.

[11] Patent Number: 5,021,756
[45] Date of Patent: Jun. 4, 1991

[54] TRANSVERSAL AND RECURSIVE FILTERS USEABLE IN A DIPLEXER

[75] Inventors: Yusuke Tajima, Acton; Manfred J. Schindler, Newton, both of Mass.

[73] Assignee: Raytheon Company, Lexington, Mass.

[21] Appl. No.: 292,712

[22] Filed: Jan. 3, 1989

[51] Int. Cl.$^5$ .................. H03H 7/46; H03H 15/00
[52] U.S. Cl. .................. 333/132; 333/166; 330/286; 330/54
[58] Field of Search .................. 333/166, 18, 132; 330/286, 54; 370/37, 38

[56] References Cited

U.S. PATENT DOCUMENTS

| | | | |
|---|---|---|---|
| 2,790,956 | 4/1957 | Ketchledge | 333/166 X |
| 4,238,744 | 12/1980 | Iwahara | 333/132 |
| 4,291,286 | 9/1981 | Wagner | 333/166 |
| 4,311,966 | 1/1982 | Bert et al. | 330/286 |
| 4,661,789 | 4/1987 | Rauscher | 333/202 |
| 4,751,744 | 6/1988 | Pavio, Jr. | 330/54 X |
| 4,772,858 | 9/1988 | Tsukii et al. | 330/286 X |

*Primary Examiner*—Benny Lee
*Attorney, Agent, or Firm*—Denis G. Maloney; Richard M. Sharkansky

[57] ABSTRACT

Transversal and recursive filters having an input propagation lumped element network with a band pass filter response, a low pass filter response, or a high pass filter response, and an output propagation network having a low pass frequency response, a high pass frequency response, or a band pass frequency response are described. Weighting means including a plurality of field effect transistors are used to successively couple the input propagation network and the output propagation network. The general shape or response of the transversal filter is provided by choosing the characteristics of the input and output propagation networks in relation to the desired filter response. With the general shape provided by the propagation networks rather than only by the transversal elements, fewer transversal elements are required to provide a desired response. Thus, the transversal filters are smaller which increases the manufacturability of the circuit and reduces the cost of the circuit particularly when fabricated as a monolithic microwave integrated circuit. Further, for transversal filters having a bandpass characteristic, harmonic subbands generated at high frequencies are eliminated by use of lumped element networks having cutoff frequencies coinciding with the frequency skirts or bandedges of the filter.

27 Claims, 13 Drawing Sheets

TRANSVERSAL AND RECURSIVE FILTERS USEABLE IN A DIPLEXER

BACKGROUND OF THE INVENTION

This invention relates generally to radio frequency filter circuits and more particularly to radio frequency transversal and recursive filters.

As is known in the art, a transversal filter, for example, samples a signal at a plurality of intervals of time, weights each one of the individual sampled signals, and sums each one of the individual sampled signals to produce an output signal.

Transversal filters are more common in digital signal processing. However, analog versions of transversal filters are also known. Exemplary of an analog transversal filter of the prior art fabricated from discrete components is shown in U.S. Pat. No. 4,291,268 to Wagner. Wagner describes a transversal filter having an input delay line coupled to an output delay line by a plurality of transversal elements. Both the input and output delay lines are distributed microstrip transmission lines. The lines have low pass characteristics with cutoff frequencies above that of the transversal elements. Field effect transistors are used as the transversal elements to weight signals coupled between the input and output lines. The transistors are successively coupled by the input line and spaced by a phase shift $t_a$ corresponding to a predetermined phase delay. Similarly, the output electrodes are also spaced by a phase shift $t_b$ corresponding to a predetermined phase delay.

An input signal propagates along the input delay line and has portions thereof successively coupled to the transversal elements. Each successive portion has is provided with a successively increasing phase delay given by $Nt_a$. Likewise output signals from each one of the transistors are successively coupled to an output terminal by the output lines with successive phase delays $N(t_a+t_b)$, where N is the number of phase shift lengths between the input electrodes of the transistors.

In transversal filter theory, it is known that by selecting the values of the weighting factors for the transversal elements, a selected filter response is provided. For example, a bandpass, low pass, or high pass filter response characteristic may selectively be provided with such an arrangement.

To provide a bandpass characteristic having steep or sharp frequency cutoffs at the band edges in the Wagner filter and those of the prior art, it is generally required to have a large number of transversal elements typically in excess of 20-26. This follows in the Wagner circuit because the microstrip transmission lines have cut-off frequencies substantially above the frequency capabilities of the transistors. Thus the transmission lines do not contribute to the basic shape of the frequency passband of the filter.

When one considers that the phase delays $t_a$ and $t_b$ in the Wagner filter are related to a multiple of a quarter of a wavelength at a frequency of operation of the filter, it becomes apparent that to provide a bandpass characteristic having very steep band edge slopes may require $25 \times \lambda/4$ or $6.25 \lambda$ lengths each of input and output delay transmission line length. That is, a 25 element transversal filter will have input delay and output delay lines equal to 6.25 wavelengths each for a total of 12.5 wavelengths at the nominal frequency of the filter.

In gallium arsenide, for example, a preferred material for fabrication of monolithic microwave integrated circuits, a wavelength at 10 GHz equals approximately 11 millimeters. Accordingly, at 10 GHz such a transversal filter would have a length equal to approximately 132 millimeters. Such a circuit is extremely large for a monolithic microwave integrated circuit. Furthermore, since each chip would be large in size, the number of chips which may be processed per wafer is concomitantly reduced, and the cost of such a circuit would be relatively high. One of the advantages of monolithic microwave integrated circuits is the ability to fabricate large numbers of identical circuits on a single wafer in one fabrication step. This advantage is reduced by very large chip sizes. Furthermore, the yield of good devices from any particular wafer would also be concomitantly reduced, due to the lower number of circuits per wafer and the requirement to have correct processing occur over a large area to provide a single complete, operable device. Electrically, the lengths of the transmission lines also pose problems for the microwave designer. The 132 mm length lines would tend to be extremely lossy, requiring complex compensation to maintain the designed for coefficients for the weighting factors. Furthermore, a very large integrated circuit, as would be expected from this technique, would be difficult to use in certain applications of these circuits. One application of a transversal filter would be as part of a phased array network for a phased array antenna. Extremely large circuits as indicated above would make their use in a phased array network extremely difficult, since the elements of the phased array network are generally spaced approximately $\lambda/4$ to $\lambda/2$ (free-space) wavelengths apart. Therefore, packaging of these circuits in such a phased array network with other required phased array components would be extremely difficult.

A second problem with the conventional transversal filter as exemplified by Wagner is that as a bandpass filter harmonic passbands are also present. The harmonic passbands are produced because the essential band characteristics of the microstrip transmission lines which provide input and output lines are as low pass filters having very high cut-off frequencies beyond the desired passband of the filter. The circuit is designed such that over a given frequency band, the signals components through each element add up in some predetermined phase relationship. However, at harmonics of this frequency band, this relationship is also true. Therefore, at each harmonic of the transversal filter, there would be a corresponding passband. In certain applications of transversal filters, such as an electronic surveillance measures systems, the presence of harmonic passbands makes processing of received signals more difficult or requires the use of additional filtering to remove the harmonic passbands.

A recursive filter is similar to a transversal filter except that the recursive filter includes recursive elements, that is elements which sample the output signal over intervals of time and feed the output signal back to the input side of the filter. If a recursive filter is fabricated in the same manner as that described in the Wagner patent by use of recursive elements, the problems associated with the transversal filter will equally apply to the recursive filter. Recursive filters due to feedback are generally smaller than transversal filters. The structure described by Wagner does not easily apply to recursive elements since it would require two field effect transistors connected in two opposite directions. The resulting feedback from this particular arrangement may be highly unstable.

Accordingly, it is desirable to provide an analog transversal or analog recursive filter which has the desirable frequency slope characteristics as provided when a large number of transversal and/or recursive elements are used but without the large space requirement. Furthermore, it is also desirable to provide a transversal and/or recursive bandpass filter which does not have harmonic passbands.

SUMMARY OF THE INVENTION

In accordance with the present invention, a bandpass filter includes a phase delay line having a cut-off frequency corresponding to one of a pair of band edges of the passband filter connected to a first one of an input terminal and output terminal of the filter, and a phase advance line having a cut-off frequency corresponding to the second one of the pair of band edges of the passband filter connected to a second one of the input terminal and output terminal of the filter, and means for weighting successive, phase shifted portions of signals fed between the phase delay and phase advance lines. The cutoff frequencies of the delay and advance lines are selected to coincide with the frequencies of the band edges (i.e. the frequency skirts) of the bandpass transversal filter. With this particular arrangement the basic filter response or shape is determined by the phase delay and advance lines. Fewer transversal or recursive elements are needed to provide a bandpass filter response having the desired sharp or steep band edge slopes. The phase delay line is selected to have a cut-off frequency corresponding to the upper edge of the passband characteristic whereas the phase advance line is selected to have a cut-off frequency corresponding to the lower edge of the passband characteristic. This provides the filter with the basic passband characteristic. By appropriate selection of the weights for each of the successive signals, the bandpass filter can have sharp frequency roll-off at the band edges. The weighting means may be any selected combination of transverse and recursive elements. Due to the basic passband characteristic of the combination of phase advance and phase delay lines, harmonic passbands are eliminated without the need for additional filtering. Further, the basic passband characteristic obviates the need for a large number of transverse or recursive elements to provide sharp frequency roll-off as generally required with prior approaches. Thus, a compact, easily fabricated, low-cost monolithic approach is provided.

In a preferred embodiment, the weighting means includes a plurality of transversal elements, each element including a field effect transistor disposed to couple between the phase delay line and the phase advance line. The weighting means are selected to provide selective weights to the coupled signals by selecting the size of the transistors in accordance with the desired weight value assigned to the signals propagating therethrough.

In accordance with a further aspect of the present invention, a transversal filter having a first one of a high pass, low pass, and bandpass frequency characteristic, and an input terminal and an output terminal includes first and second lines selected from a low pass, high pass, and bandpass characteristic each one of said lines comprised of a plurality of lumped elements. The corresponding frequency characteristics of the lines are selected to coincide to the corresponding frequency characteristics of the transversal filter. A first one of the pair of lines is coupled to the input terminal and a second one of the pair of lines is coupled to the output terminal. Weighting means are successively coupled between the lines for providing a plurality of weighted amplitude signal portions from an input signal propagating along the line coupled to the input terminal to the line coupled to the output terminal. With this particular arrangement, the fundamental shape of the desired passband characteristic of the transversal filter is provided by choosing the cut-off frequency of the pair of networks to be adjacent the passband skirt frequency of the filter. Therefore, the number of transversal elements required to provide a sharp frequency roll-off at the band edges of the transversal filter is substantially reduced, since the basic filter response is provided by the selected filter responses of the networks rather than by the transversal elements. This permits a transversal filter having fewer elements and therefore smaller chip size to be fabricated as a monolithic microwave integrated circuit. Furthermore, by appropriate selection of the weight values of the transversal elements. Other filter responses besides the selected one of low pass and high pass may be provided.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
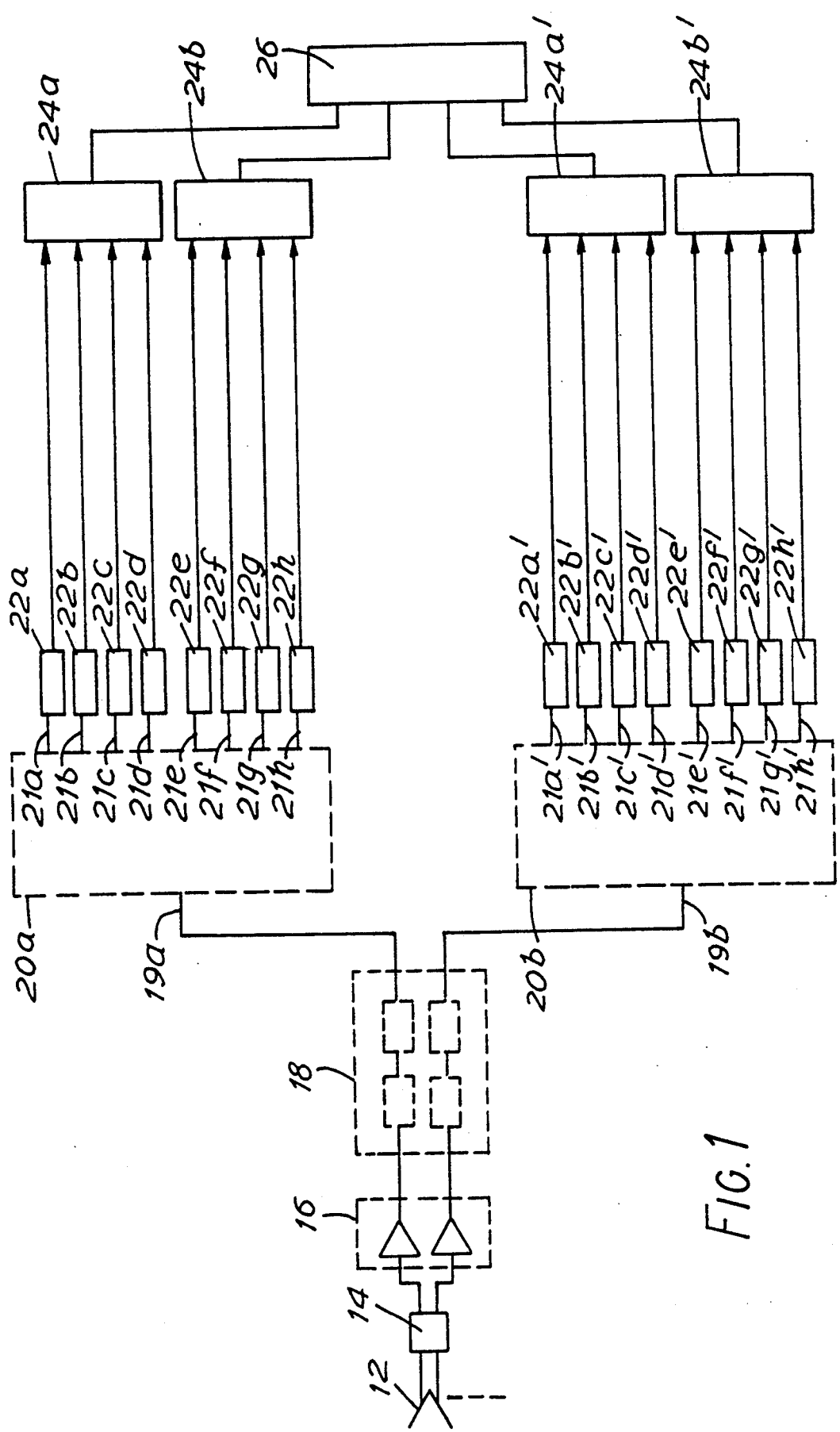
FIG. 1 is a block diagram of a typical electronic surveillance measure receiver front end.
Figure 2:
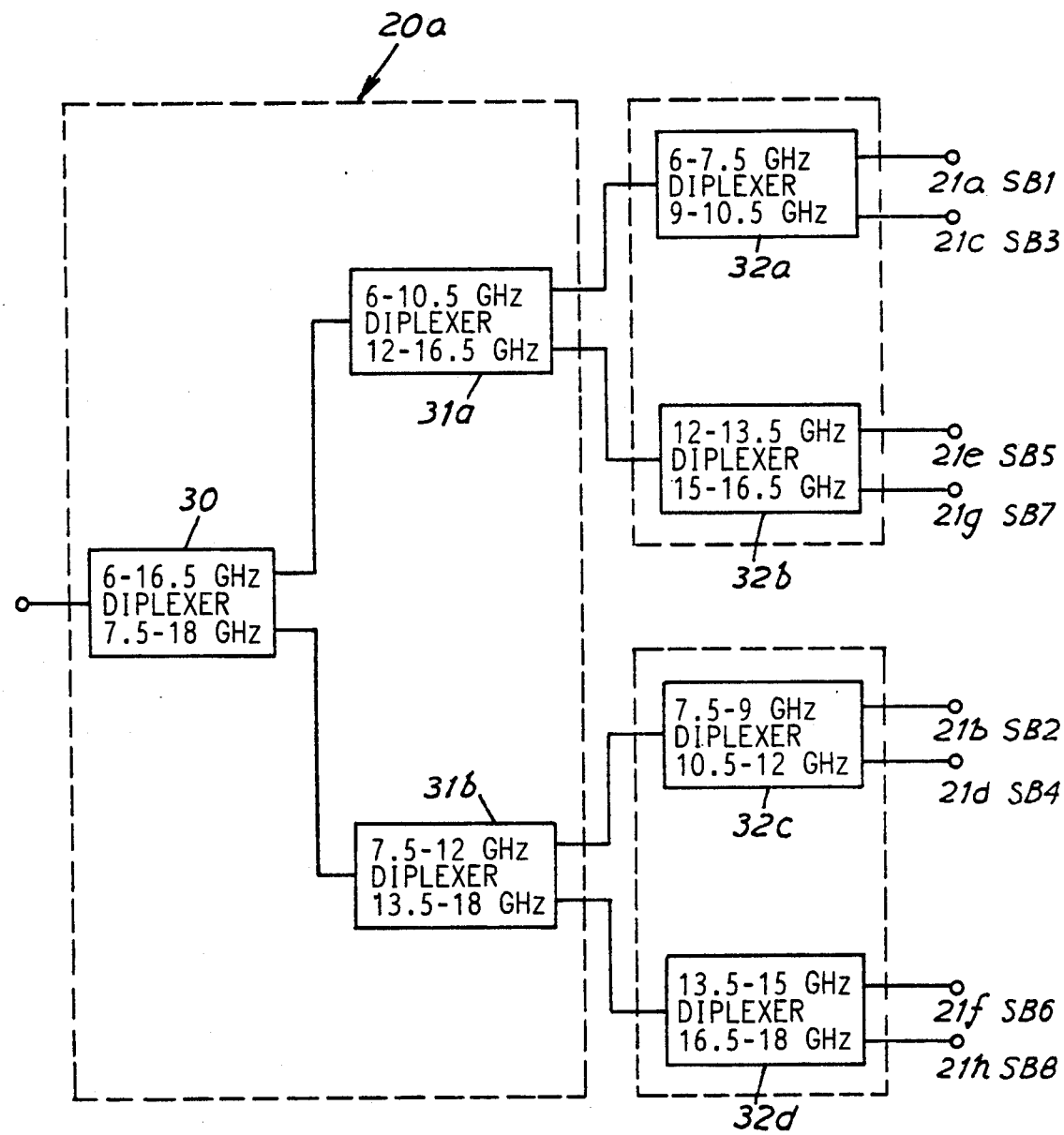
FIG. 2 is a block diagram of a first embodiment of an eight channel frequency multiplexer including a plurality of diplexer elements.

Referring now to FIG. 1 a front end portion of an electronic surveillance measure (ESM) receiver is shown to include a phased array element 12 which is coupled to a hybrid coupler 14 and which feeds a pair of low noise amplifiers 16. Thus, from the phased element 12 vertical polarized and horizontal polarized electromagnetic signals are fed through the coupler. From such signals are provided right-hand circular polarized and left-hand polarized output signals which are amplified by the low noise amplifiers 16 and fed to amplitude and phase control circuit 18. The amplitude and phase control circuits which are required are generally a phase shifter and an attenuator. From the output of the phase control and amplitude control circuits 18, the signals are fed to one of a pair of frequency multiplexers 20a, 20b. The frequency multiplexers 20a, 20b here shown in block diagram form and will be further described in conjunction with FIG. 2 provide from an input signal fed to terminals 19a, 19b one pair of a plurality of pairs of output signals at terminals 21a–21h and 21a'–21h' in accordance with the frequency characteristics of the input signal. That is, the frequency multiplexer 20a is used to divide the input signal into a plurality of sub-band signals of left-hand circular-polarization and right-hand circular polarization having selected frequency bandwidths in a manner to be described in conjunction with FIG. 2. The outputs 21a–21h from the frequency multiplier 20a and outputs 21a'–21h' from frequency multiplexer 20b are fed to mixer/amplifier circuits 22a–22h, 22a'–22h' and such signals are fed by a local oscillator signal LO which provides in combination with the mixer portion of the circuits 22a–22h, 22a', 22b' an I.F. frequency signal at the output thereof in a manner which is generally known.

Frequency multiplexers 20a, 20b are each arranged to provide even and odd sub-bands such that the odd sub-bands are coupled to outputs 21a–21d, 21a'–21d' and the even sub-bands are coupled to outputs 21e–21h, and 21e'–21h'. These output signals are here combined by power combiners 24a, 24b and 24a', 24b' and are fed to the receiver processor 26. Amongst other tasks, the receiver processor 26 compares signals from the outputs of power combiners 24a–24b and 24a'–24b'. Dividing the input signal and combining even and odd sub-band signal components permits the receiver processor 26 to track the input signal through a sub-band and betwen adjacent odd and even sub-bands as long as the filter skirt or "roll-off" characteristics of the frequency multiplexer are well known. Thus, the outputs from the power combiner 24a and 24b are fed to a receiver processor 26 and determinations are made by the receiver processor on the characteristics of the signals fed thereto in a manner which is generally known.

Referring now to FIG. 2, a first embodiment of an eight channel frequency multiplexer here 20a for use in the receiver in FIG. 1 is shown to include a plurality of, here seven diplexer circuits 30, 31a, 31b and 32a–32d. The diplexer circuits 30, 31a, 31b and 32a–32d are each chosen to have a pair of passband frequency characteristics. In particular, the diplexer circuit 30 connected the input of the frequency multiplexer is selected to have a relatively broadband frequency passband characteristic, whereas the diplexer elements 32a–32d at the outputs 21a–21h of the multiplexer 20a are selected to have relatively narrowband frequency characteristics.

In the example here described, the ESM receiver has a bandwidth of 6–18 GHz. Accordingly, the input signal fed to terminal 19 of the eight channel multiplexer 20a has a bandwidth of 6–18 GHz. Since eight channels will be provided from the output of each frequency multiplexer 20a, 20b, each one of said channels 21a–21h has a passband of 1.5 GHz. Further, with the arrangement to be described, the odd sub-bands are provided at outputs 21a, 21c, 21e, and 21g and the even sub-bands are provided at outputs 21b, 21d, 21f, and 21h as shown.

Thus, here the first diplexer element 30 has a pair of passbands. The first passband being over the range of 6–16.5 GHz, and the second passband being over the range of 7.5–18 GHz. The first passband is fed to a diplexer 31a and the second passband is fed to a diplexer 31b. Diplexer 31a will feed the odd diplexer elements 32a, 32b, whereas diplexer 31b will feed the even diplexer elements 32c and 32d. Diplexer 30 provides a first band comprised of sub-bands corresponding to sub-bands SB1-SB7 (outputs 21a–21g) and is fed to diplexer 31a. Thus, excluded from the first output of diplexer 30 is subband 8. Diplexer 31a provides a first signal corresponding to channels or sub-bands SB1-SB3, the second one corresponding to sub-bands SB5-SB7, Dropped at the second diplexer element therefore is sub-band SB4. The first odd diplexer 32a provides sub-bands SB1, SB3, and the second odd diplexer 32b provides sub-bands SB5 and SB7. Thus, dropped or rejected from the first odd sub-band diplexer 32a is sub-band SB2, and dropped from the second odd diplexer is sub-band SB6. Thus, provided at the outputs 21a, 21c, 21e and 21g of the odd diplexers 32a, 32b are sub-bands SB1, SB3, SB5, and SB7.

Diplexer 30 also provides the second output including sub-bands SB2-SB8 and thus excluded from the second output from the diplexer 30 is sub-band SB1. Sub-bands SB2-SB8 are fed to the diplexer element 31b which provides a first output comprised of sub-bands SB2-SB4 and a second sub-band output comprised of sub-bands SB6-SB8, thus excluded from the second diplexer element 31b is sub-band SB5. Diplexer 32c provides passbands corresponding to sub-bands SB2 and SB4 at outputs 21f and 21d, thus excluding sub-band SB3 whereas diplexer 32d provides passbands corresponding to sub-bands SB6 and SB8 at outputs 21f and 21h and thus excludes sub-band SB7. Therefore, at the output of the frequency multiplexer 20a are provided even sub-bands at terminals 21b, 21d, 21f, and 21h and odd sub-bands at terminals 21a, 21c, 21e and 21g.

Figure 3:
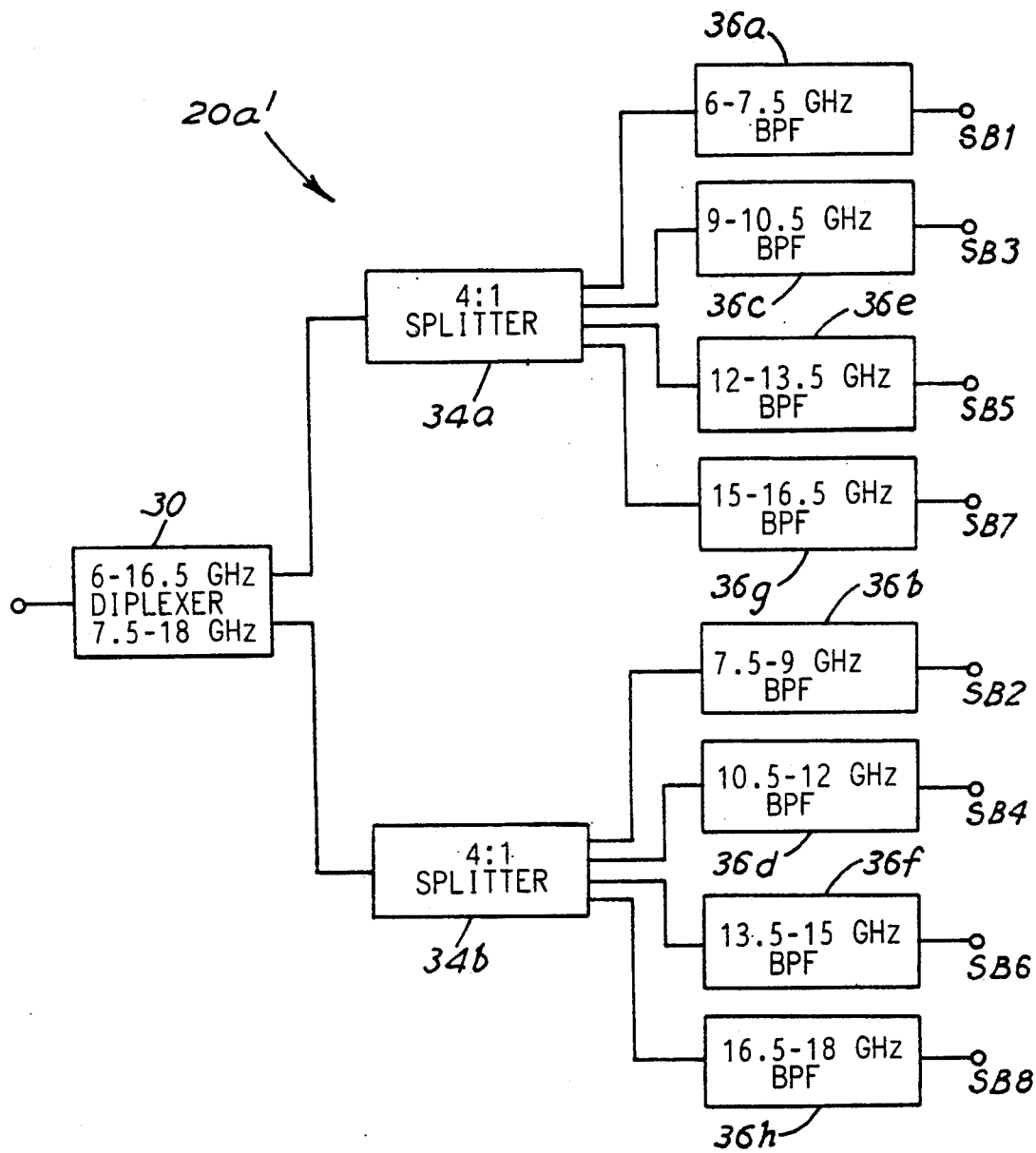
FIG. 3 is an alternate embodiment of an eight channel frequency multiplexer including a single diplexer element.

Referring now to FIG. 3, an alternate embodiment for an eight channel multiplexer is shown to include a diplexer 30 as described in conjunction with FIG. 2, which provides a pair of outputs which fed a pair of 4:1 power splitters 34a, 34b, as shown. Power splitter 34a feeds bandpass filters 36a, 36c, 36e, and 36g, whereas power splitter 34b feeds bandpass filters 36b, 36d, 36f, and 36h. Each one of the characteristics of the bandpass filters 36a–36h is selected to provide a 1.5 GHz wide passbands over the frequencies indicated to provide sub-bands SB1-SB8, as shown.

The diplexers 30, 31a, 31b, and 32a–32d of FIG. 2, diplexer 30 and bandpass filters of FIG. 3 are here each provided by transversal or recursive filters. The diplexers may be provided by using two transversal filters arranged to share a common input line. The bandpass filter are either transversal or recursive filters having a bandpass characteristic.

Thus, transversal and recursive filters which are readily adaptable for use in such applications will now be described.

Figure 4:
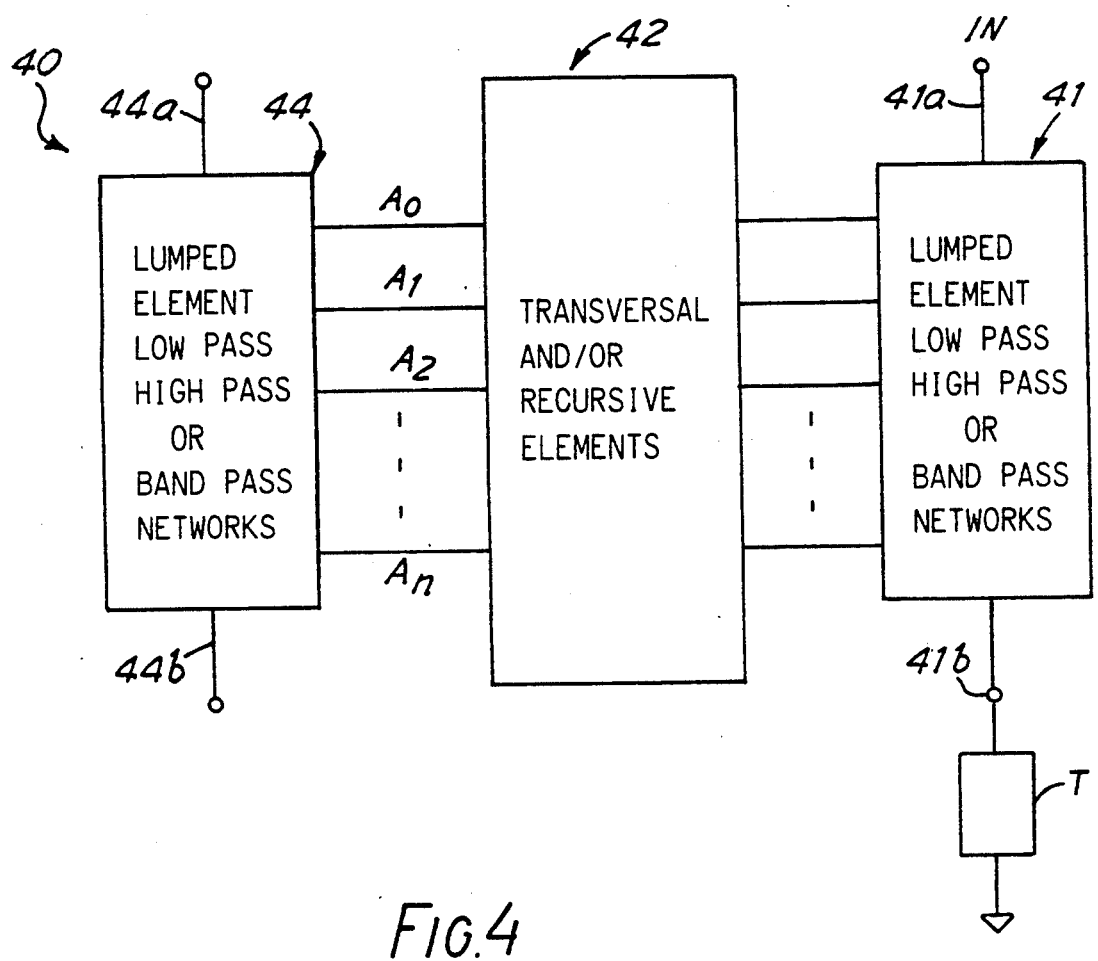
FIG. 4 is a generalized block diagram of a transversal filter in accordance with a first aspect of the present invention.

Referring now to FIG. 4, a generalized block diagram of a transversal filter 40 is shown to include an input network 41 comprised of lumped elements having a selected passband characteristic selected from the group of a low pass filter, a high pass filter, and a bandpass filter characteristic. A weighting network 42 comprised of transversal and/or recursive elements is coupled to the input network and is arranged such that successive portions of an input signal fed to the input network are coupled to successive ones of weighting elements of the weighting network. The outputs of the weighting network are coupled to an output network 44 comprised of lumped elements having a selected passband characteristic selected from the group of a low pass filter, a high pass filter, and a bandpass filter characteristic. The weighting network 42 feeds successive portions of the input signal fed to network 41, each portion having an assigned weight here represented by coefficients $A_0, A_1, A_2 \ldots A_n$ to the output network 44. Each of networks 41 and 44 have a pair of terminals 41a, 41b and 44a, 44b respectively. One of each of said pair of terminals provides respectively, the input terminal and output terminal of the transversal filter 40. The other one of each of said pair of terminals provides impedance terminations, T. The terminations, T, are preferably open circuits having an infinite impedance or could be others such as a characteristic impedance of the particular network.

The weighting network 42 is comprised of elements which couple selected portions of the successive signals between the input network and output network. In general, the transversal elements which couple from input to output are field effect transistors having a gate electrode as an input and drain electrode as an output. Recursive elements which couple from output to input (i.e. feedback) could also be field effect transistors although their use may complicate stability considerations, and are preferable passive components such as resistors. The coefficients are determined in accordance with well-known filter theory modified as will be described herein and are provided by varying the size of the transistors (i.e. selecting the gate length). This will provide transistors having various gains and thus weights. Similarly, with recursive elements, the values of resistors are selected to provide different weights and in particular may typically range between 50Ω to 2KΩ.

The generalized network shown in FIG. 4 may be constructed to provide any desired passband characteristic. The basic shape of the transversal filter response is provided by using lumped element networks 41 and 44 having selected passband characteristics corresponding to the basic shape of the transversal filter response. The weighting means are used to improve the response (i.e. provide sharper cut-off or roll-off at the band edges) rather than form the basic shape of the response, as in prior approaches.

Specific examples of bandpass filter responses will be described in conjunction with FIGS. 5-7 and 5A-7A. Other responses are also possible. For example, low pass or high pass filters having sharp roll-off may be provided.

Table 1 below provides possible but by no means all choices for networks 41 and 44 to provide a basic passband characteristic to be improved upon by appropriate selection of coefficients $A_o-A_n$. Each network 41, 44 has a cut-off frequency corresponding to a cut-off frequency of the transversal filter.

TABLE 1

| Network 41 | Network 42 | Passband Type |
|---|---|---|
| Low Pass | Low Pass | Low Pass Filter |
| Low Pass | High Pass | Band Pass Filter |
| High Pass | Low Pass | Band Pass Filter |
| High Pass | High Pass | High Pass Filter |
| Band Pass | Band Pass | Band Pass Filter |

Further, by providing networks having 2 different cut-off frequencies with passbands which destructively overlap, other more exotic filter responses may be possible.

Unlike conventional transversal filters employing broadband input networks and output networks, here the transversal filters employ lumped element networks having a passband characteristic which is used to define in part the passband characteristic for the transverse filter. This may be further explained in conjunction with FIGS. 5-7 and 5A-7A.

Figure 5:
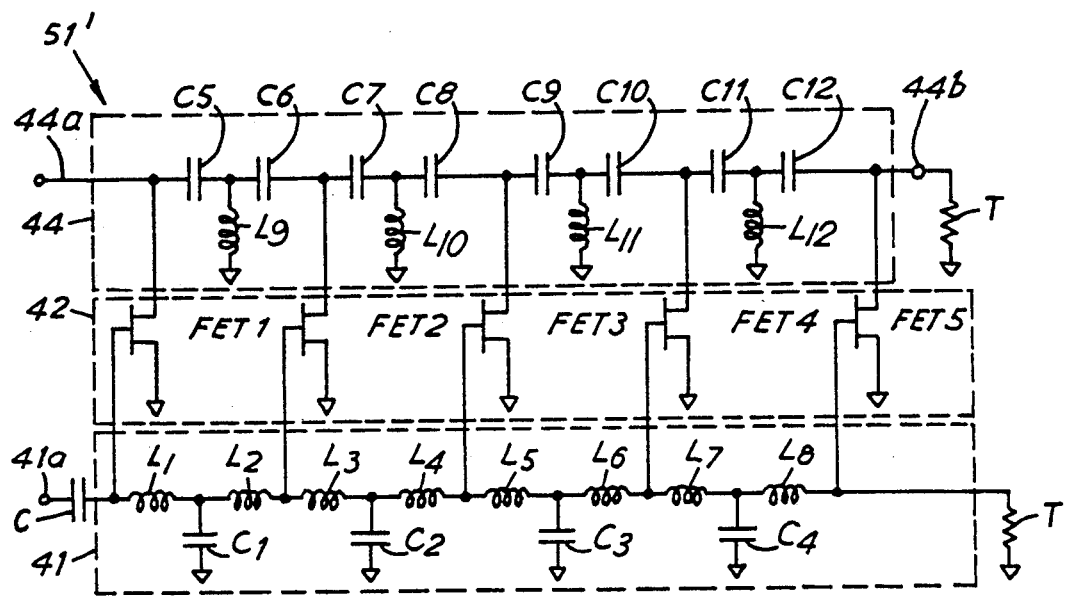
FIG. 5 is a schematic diagram of a transversal filter in accordance with a further aspect of the present invention.
Figure 5A:
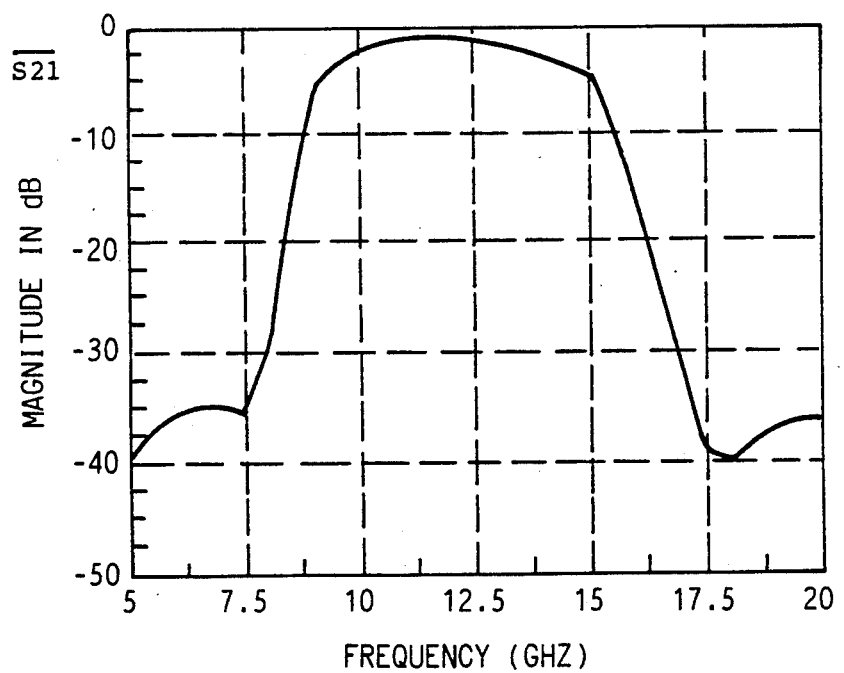
FIG. 5A is a plot of $|S_{21}|$ in dB vs. frequency for a simulation of the circuit shown in FIG. 5.

Referring first to FIGS. 5, 5A, a first general embodiment of a transversal filter 51' is shown to include the network 41 comprised of a plurality of series connected inductors $L_1-L_8$ and shunt mounted capacitors $C_1-C_4$. Network 41 is provided as a lumped element, low pass filter terminated, with termination T, in the characteristic impedance in accordance with the characteristic impedance of the network 41, and as a low pass filter provides phase delay to an input signal fed thereto. The output network 44 is here comprised of a plurality of series connected capacitors $C_5-C_{12}$ and shunt mounted inductors $L_9-L_{12}$. Here network 44 is a high pass filter which provides a phase advance characteristic to signals propagating thereto. Here transversal elements FET 1-FET 5 are used to couple selected portions from the input network 41 to the output network 44.

In operation, an input signal is fed to input terminal 41a. The input signal has a bandwidth which is greater than the bandwidth of the signal to be coupled from the output of the element at terminal 44a. A D.C. blocking capacitor C connected between terminal 41a and the network 41 is used to prevent upset in the D.C. bias characteristics of the transversal elements in network 42. The input signal propagates along the network 41 and is delayed by successively increasing increments in phase between each one of the gate electrodes of the transistors FET 1-FET 5. Thus successive portions of said signal, each having successively increasing amount of phase delay are fed through the field effect transistors FET 1-FET 5. The field effect transistors FET 1-FET 5 each provide selected weighted amplitudes to output signals in response to the input signal.

The weights are selected in accordance with the desired passband shape of the transversal filter 51' using well-known transversal theory. When applying classical theory, it should be kept in mind, however, that the basic shape of the filter response (i.e. the band pass response) is defined initially by the networks 41 and 44. This reduces the number of transversal elements needed and accordingly the size of the circuit. Here the selected weight values are provided to the transistors FET 1-FET 5 by appropriate selection of the gate periphery (i.e. gate length) of each one of the transistors. That is, for a signal which is to be weighted with a relatively high weight value, the gate periphery of the transistor would be relatively large, to provide such transistor with high gain and output signal amplitude. For signals which are to be weighted with a relative low weight the periphery of the corresponding transistor which provides said weighted signal would be relatively small. For extremely low weights where the size of the FET would be too small to build in a practical manner, it may be desirable to provide capacitance voltage dividers at the input of the field effect transistor.

Since the transversal filter 51' comprises an input line comprised of a low pass filter and an output line comprised of a high pass filter, the fundamental shape of the bandpass characteristic at the output of the filter is determined in large part by the passband characteristics of the input and the output networks. Thus, with this particular arrangement, fewer transversal elements and hence, a small circuit need be provided in order to provide a desired filter response. Unlike filters of the prior art which would require upwards of 20-25 transversal elements to form a bandpass characteristic having very steep phase slopes, here the bandpass characteristic of the transversal filter 51' is provided with very steep slopes by only five transversal elements.

Figure 6:
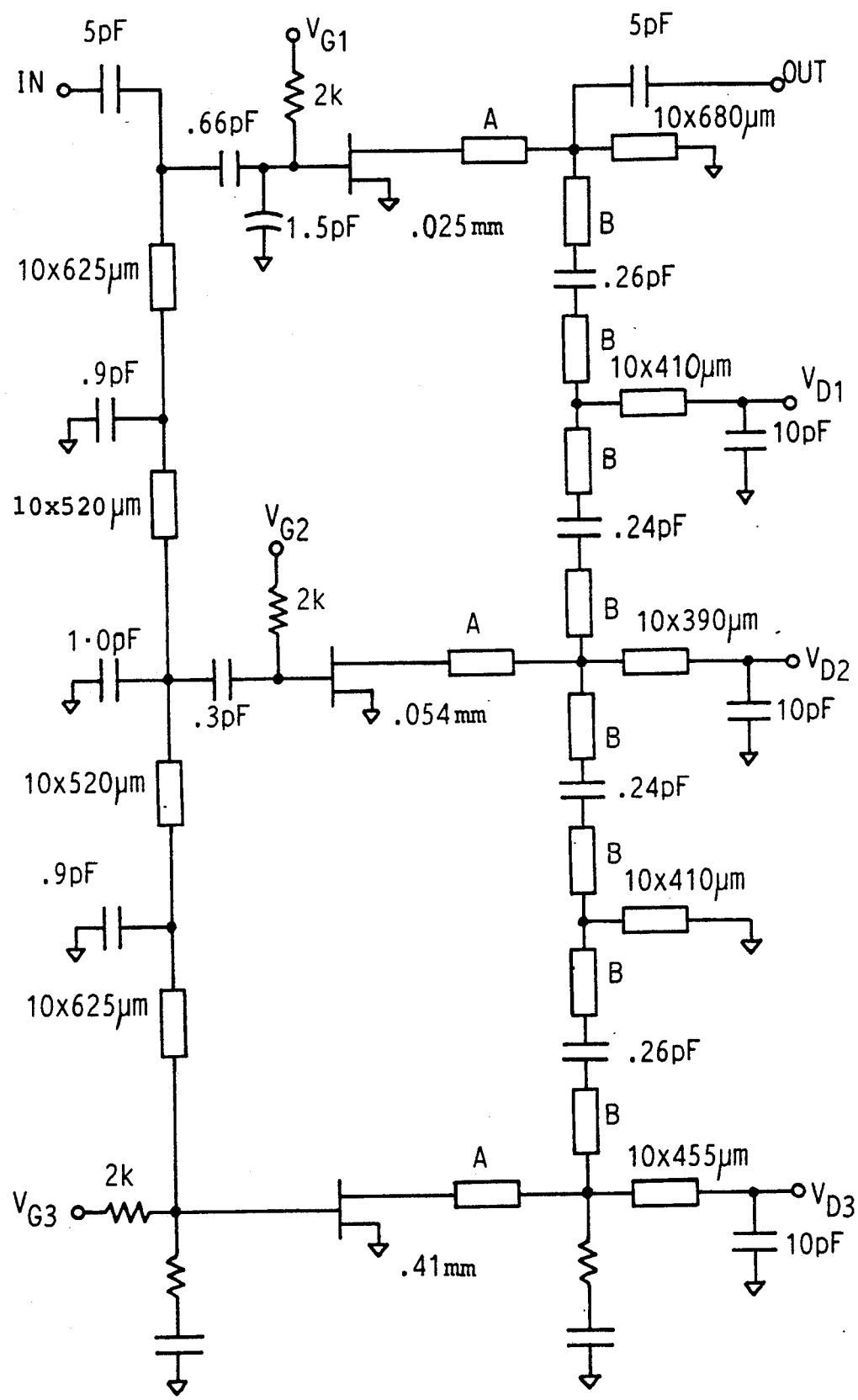
FIGS. 6, 7 particular design examples of a transversal filter having a bandpass characteristic in accordance with further aspects of the present invention.

A computer simulated design response of the bandpass filter is shown in FIG. 5 having values of inductance and capacitance for the networks 41 and 44 and values for the weight functions for FET 1-FET 5 is shown in FIG. 6.

Such a circuit was also fabricated using metal electrode semiconductor field effect transistors comprised of suitable dopant gallium arsenide layers supported on a gallium arsenide substrate having a ground plane conductor. The measured filter response ( $|S_{21}|$ forward transfer ratio and $|S_{11}|$ the forward isolation) is shown in FIG. 6A.

Here inductors were implemented by distributed lumped elements that is by sections of microstrip transmission line. The numbers next to the inductor elements refers to the width and length of the strip conductor forming the microstrip lines. Alternatively, the inductors could have been lumped elements such as spiral inductors. Spiral inductors are generally smaller for a given inductance but are also generally more difficult to model and fabricate than sections of microstrip transmission line as shown in FIG. 6.

Note in FIG. 6, two different voltage divider arrangements are used to provide small coefficients for FET 1 and FET 3. Note further that the weights assigned to FET 2 and FET 4 (FIG. 5) are zero and thus they are missing from FIG. 6.

Figure 6A:
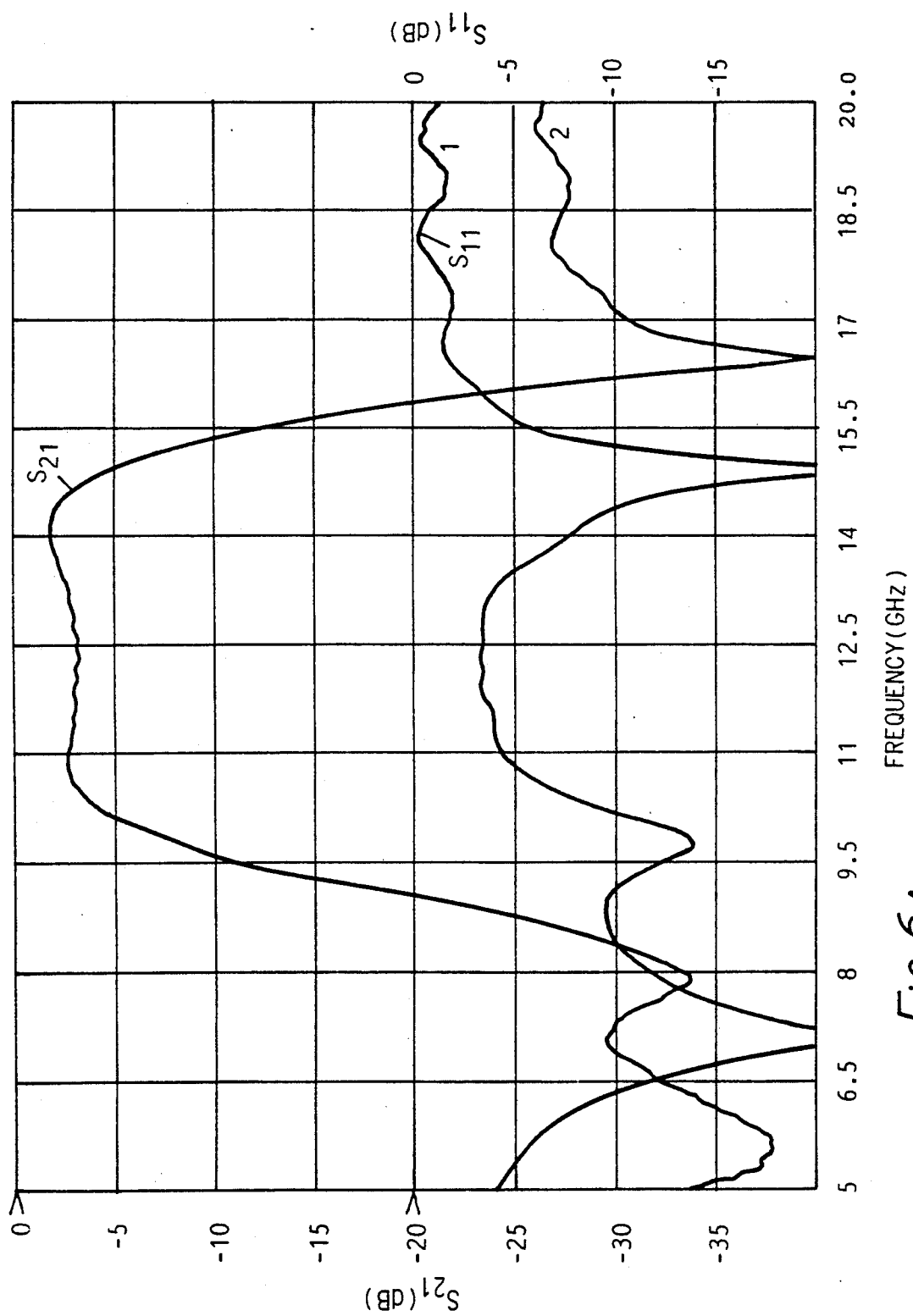
FIGS. 6A, 7A are each plots of $|S_{11}|$ and $|S_{21}|$ in dB vs. frequency for the respective design examples of FIGS. 6 and 7.

FIGS. 6 and 6A correspond to a transversal filter having a pass band of 10.3 GHz to 14.8 GHz.

Figure 7:
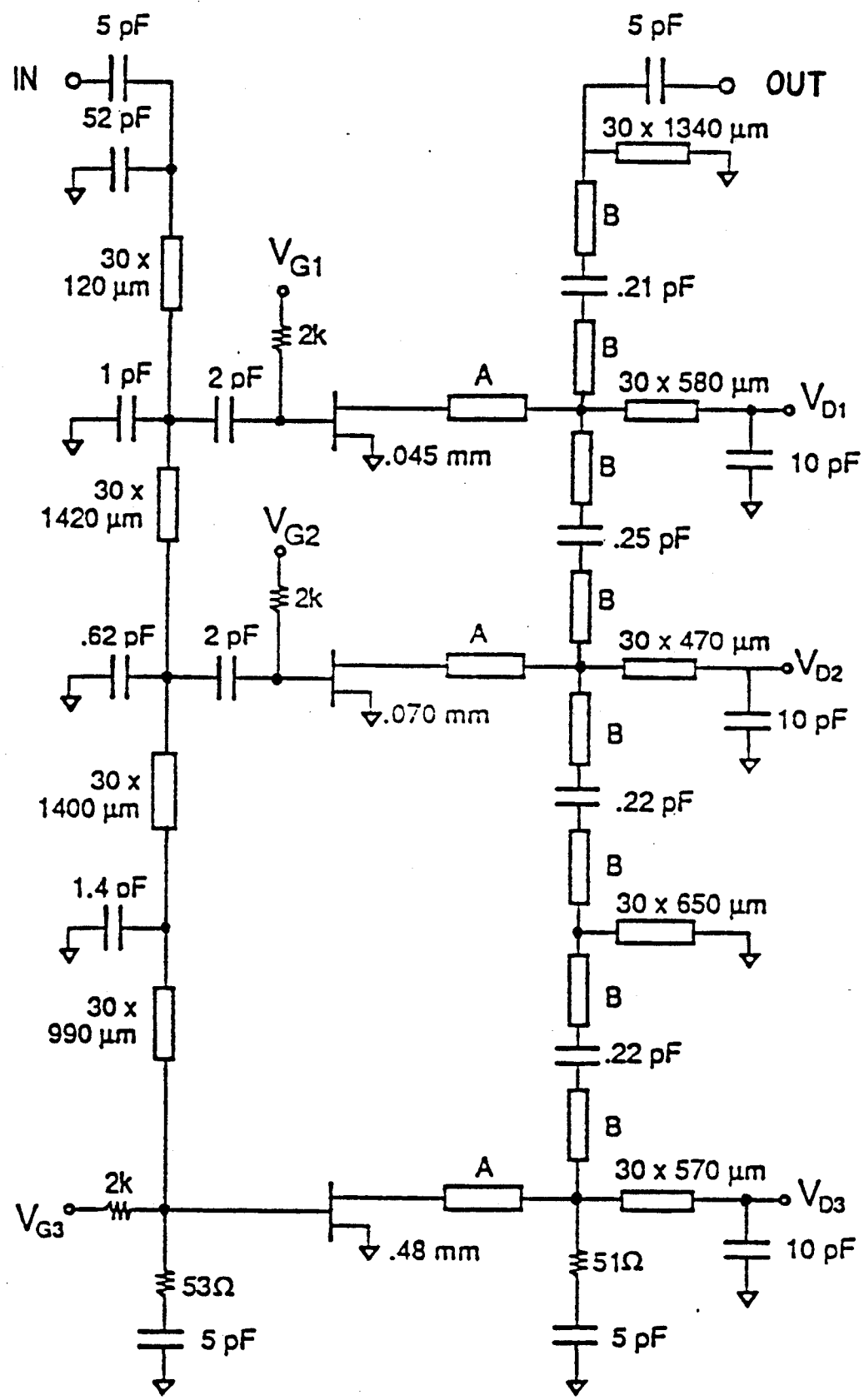
Figure 7A:
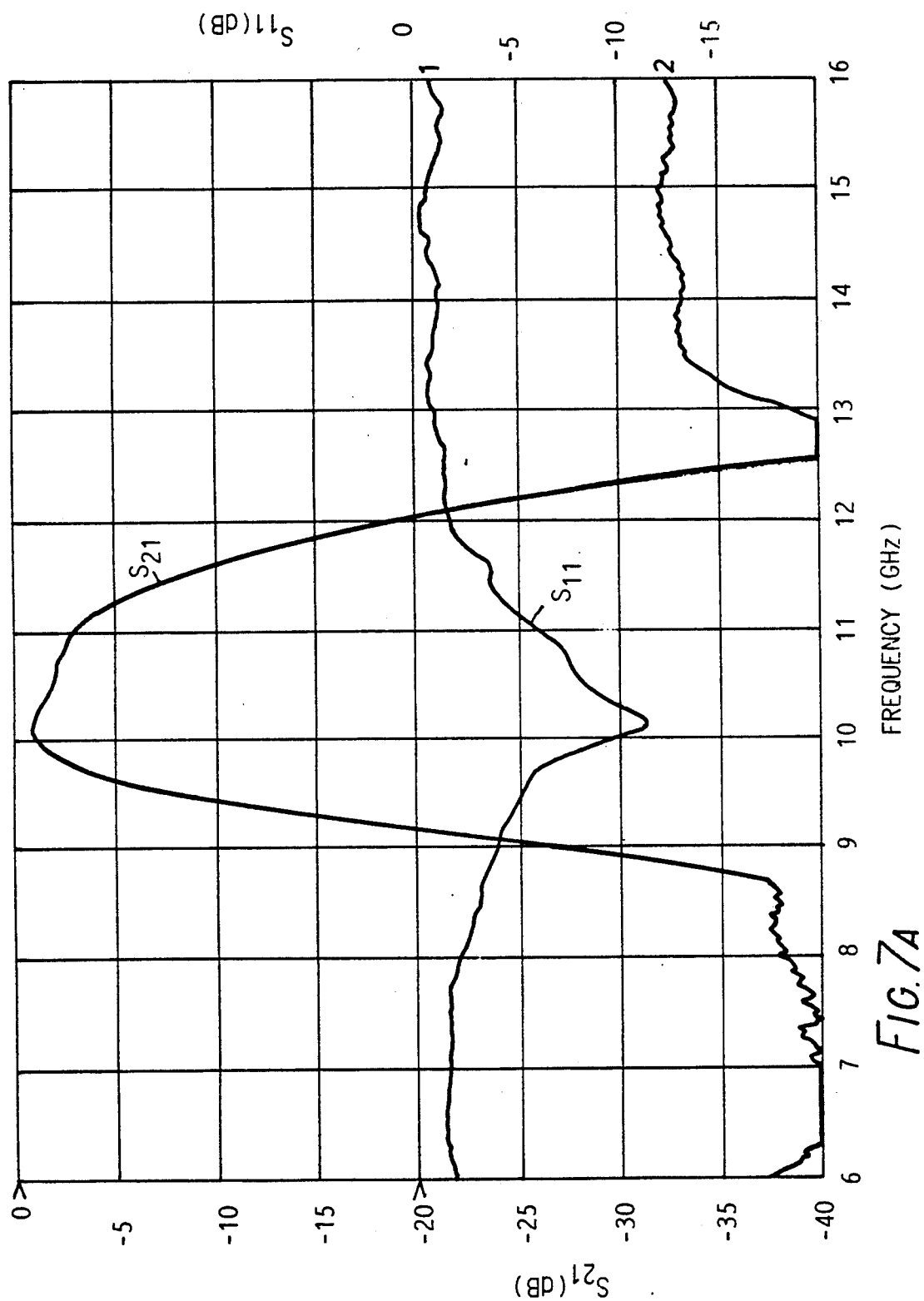

Referring now to FIGS. 7 and 7A, a second design example generally as fabricated above for FIG. 6 is shown having element values as indicated. This is a 9.8 GHz to 11.16 GHz band pass transversal filter. The measured response is shown in FIG. 7A.

In each of FIGS. 6 and 7, the element labeled "A" or "B" have the values indicated. Further in each circuit bias voltages $V_{G1}$-$V_{G3}$ and $V_{D1}$-$V_{D3}$ are fed as indicated.

Figure 8:
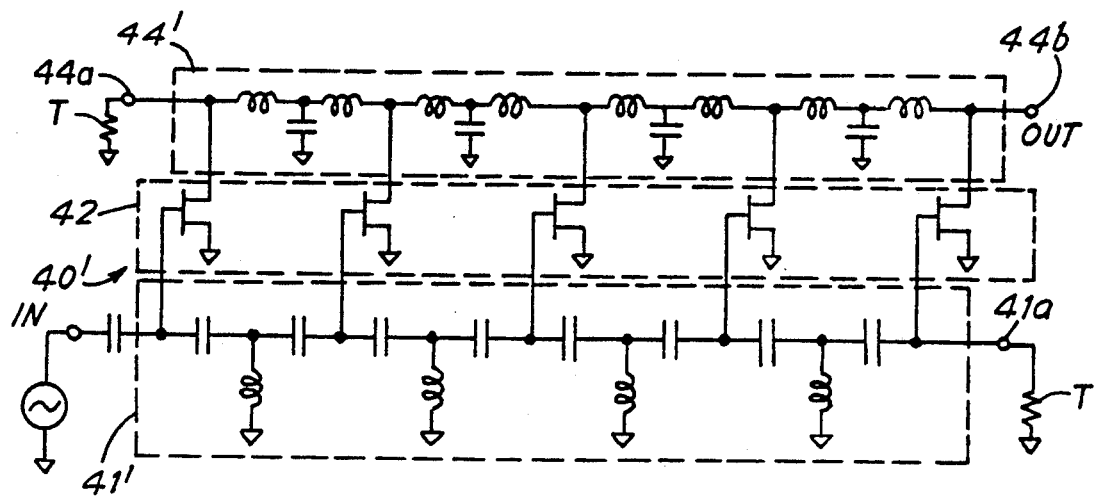
FIG. 8 is a schematic diagram of an alternate embodiment of a transversal filter.

As shown in FIG. 8, the location of the phase advance and phase delay networks may be alternated, as well as, the location of the output terminal of the circuit. Thus, the transversal filter 40' includes an input network 41' here comprised of a plurality of series connected capacitors (not referenced) and shunt mounted inductors (not referenced) which provide in combination a phase advance or high pass filter network, and network 44' includes a plurality of of series connected inductors (not referenced) and shunt mounted capacitors (not referenced), as shown, which provides here a phase delay or a low pass filter network. Network 41' and 44' are connected together by a plurality of transversal elements 42 as generally described in conjunction with FIG. 5. The output is taken at terminal 44b of the network 44' and terminal 44a thereof is terminated in an impedance T.

Figure 9:
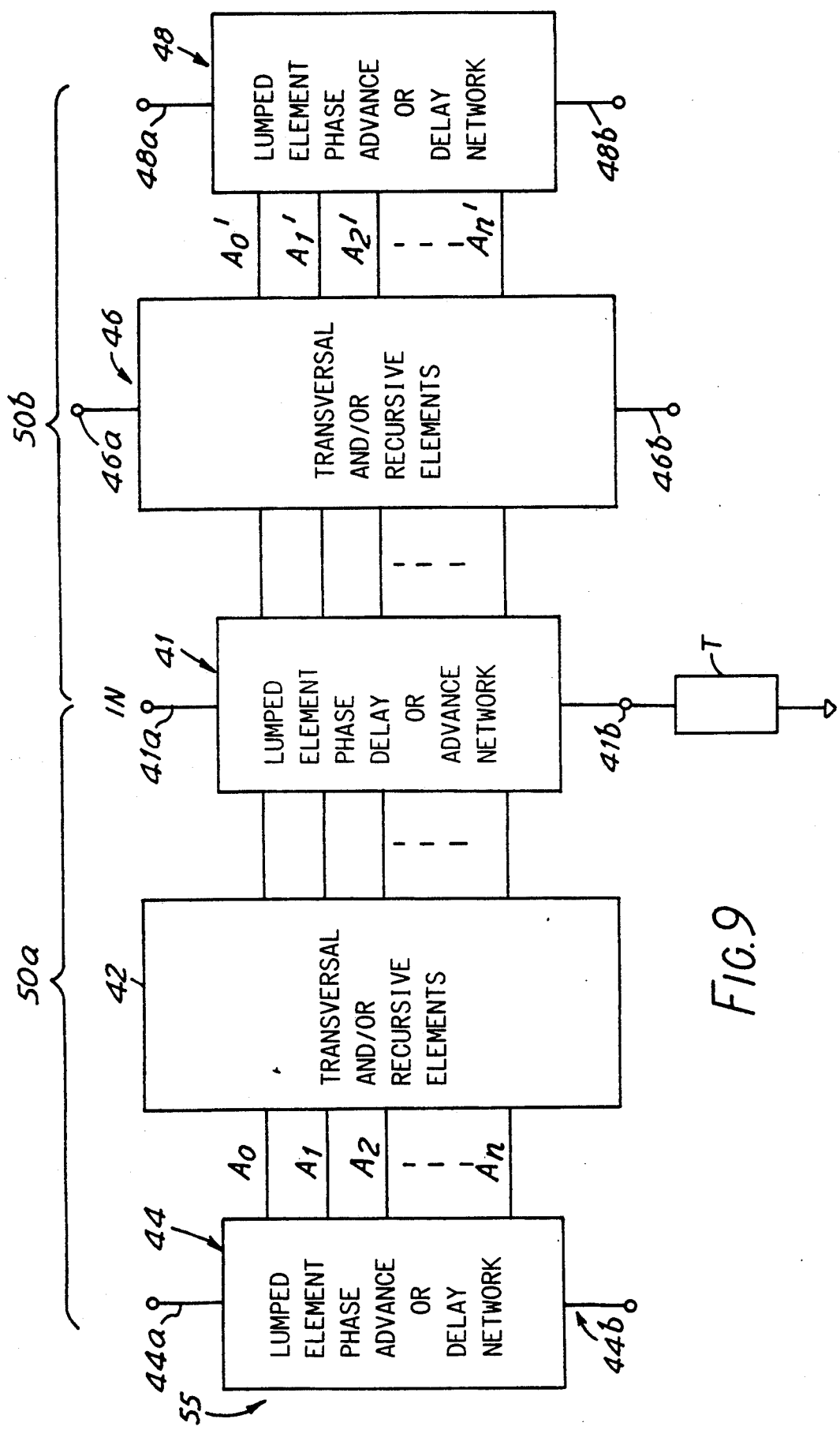
FIG. 9 is a generalized block diagram of a diplexer in accordance with a further aspect of the present invention.

Referring now to FIG. 9, a generalized block diagram of a diplexer 55 here having a pair of transversal filter element sets 50a, 50b, is shown to include a lumped element propagation network 41, here said lumped element network 41 comprised of low pass (i.e. phase delay), high pass (i.e. phase advance) or band pass circuit elements. Lumped element network 41 has an input terminal 41a and an second terminal 41b which is terminated any impedance such as an infinite impedance which does not absorb power or possible the characteristic impedance of the lumped element network 41. The diplexer 55 further includes a pair of output lumped element networks 44 and 48. Here each one of the said output networks are also lumped element networks and are comprised of high pass (i.e. phase advance) low pass (i.e. phase delay) or band pass networks. Generally, in the diplexer 55 if the input network is either a phase delay or advance network, then one of the output networks is a phase advance network and the other is a phase delay network. Input network 41 is coupled to the output network 44 by a first network 42 of transversal and/or recursive elements, and the input network 41 is also coupled to output network 48 through a second network 46 of transversal and/or recursive elements. Here each one of the networks of transversal and/or recursive elements 42, 46 are comprised field effect transistors having gate, drain, and source electrodes. Preferable, however, recursive elements are provided by resistors as described above. Transversal elements are provided by coupling the signal from the input network to the output network, that is by coupling the gate electrode to the input network and having the drain electrode feed the output network 44, for example. Recursive elements are feedback elements and thus have the gate electrode coupled to the output network 44 and have the drain electrodes coupled to feed the input network 41 or alternatively could by a resistor. The transversal and/or recursive elements, therefore, provide weighting factors $A_o$-$A_n$ to the signals coupled to the output network 44 and weighting signals $A_o'$-$A_n'$ to the lumped element network 48.

Thus, diplexer 55 is here comprised of a pair of transversal and/or recursive filter sets 50a-50b sharing a common input network line. The characteristic of each one of the transversal/recursive filters 50a-50b are selected to provide a one of a pair of selected passbands at a selected one of the terminals 44a, 44b of network 44 and terminal 48a, 48b of network 48. That is, one of said terminals 44a, 44b and 48a, 48b of each network 44, 48 is terminated in termination, T, generally having a characteristic impedance in accordance with the characteristic impedance of the lumped element network 44 and 48, and a second one of said terminals provides the output for the networks 44 and 48. Generally with transversal filters, the output of the network is adjacent to the input terminal of the network and thus, terminal 44a and 48a would be provided as the outputs of the filter when the input terminal of the filter was terminal 41a. Optionally, however, the outputs may also be provided at terminals 44b and terminals 48b. The differences in electrical pathlengths through each of the elements would necessarily have to be taken into consideration in order to change the location of the output terminal.

Referring now to FIG. 9, a diplexer 55 is shown to include a pair of transversal filters sets 50a-50b, having the general characteristics of the transversal filter 40 (FIG. 5) Diplexer 55 includes the lumped element filter network 41 as generally described in conjunction with FIG. 5 which has a first terminal 41a providing the input terminal for the network 55 and a second terminal 41b which is terminated with termination, T, having an impedance as mentioned above. A pair of output networks 44 and 48 are also provided. Here network 44 is similar to that described in conjunction with FIG. 5 for transversal element 40. Similarly, network 48 is a phase delay network, except that the passband of network 48 is different from that of network 44.

Thus, using one of the diplexer elements described in conjunction with FIG. 2 has an illustrative example, here the diplexer element 30 has a input network 41 having a passband characteristic of 6-18 GHz and has a network 44 having a passband of 6-16 GHz and network 48 having a passband of 7.5-18 GHz. By appropriate selection of the values of the components L and C of each one of the networks 44 and 48, the selected frequency passband characteristics are provided to the circuits. By selection of the values of the weighting factors provided to each one of the transversal elements of networks 42 and 46, a transversal filter response having selected passband characteristics with steep frequency slopes without harmonic passbands is provided at each one of the outputs of the diplexer 40.

Figure 11:
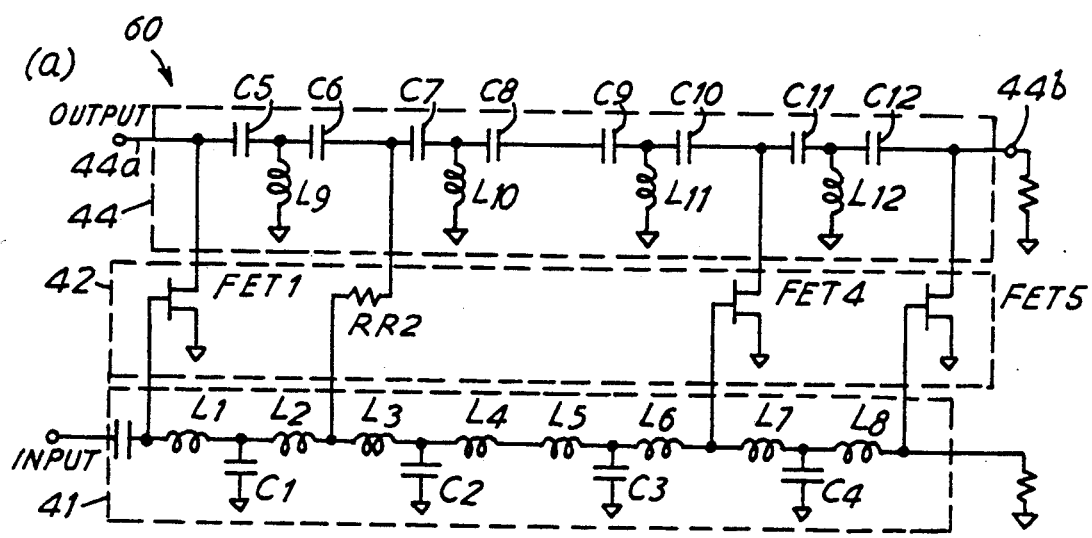
FIG. 11 is a schematic diagram of a recursive filter in accordance with a still further aspect of the present invention.

Referring now to FIG. 11, a recursive filter 60 is shown. Recursive filter 60 is similar to transversal filter shown in FIG. 5, except that the second transversal element is replaced by a recursive element here resistor RR2, which is coupled between output network 44 and input network 41, as shown. The third transversal element is omitted. Thus, element RR2 feedbacks a portion of the output signal back to the input of the recursive filter. The use of one or more recursive elements in the general lumped element distributed filters as described may provide a further improvement in performance or size reduction compared to the transversal filters, as described above.

Conventional transversal filters use delay lines in a configuration similar to travelling wave amplifiers. In this approach, the input delay transmission line feeds an array of FETs at a delay of $t_a$ between FETs while the output delay transmission line combines the output power from the FETs by instituting a delay $t_b$ between FETs. Phase delays $t_a$ and $t_b$ are related to the radian frequency, $\omega$, as;

$$t_a = \frac{\omega}{c} l_a = \beta_a l_a, \; t_b = \frac{\omega}{c} l_b = \beta_b l_b \quad \text{Eq. 1}$$

where $1_a$ and $1_b$ are the transmission line lengths of each delay lines $\beta_a$ and $\beta_b$ are the phase constants of transmission lines $1_a$ and $1_b$ respectively, and c is the phase velocity in the line. The direction of the output port can be either direction depending on the choice of the delays, $t_a$ and $t_b$.

Phase delays $t_a$ and $t_b$ are chosen to be the same in travelling wave amplifiers in order to combine the power from all the FETs in phase at the output port. This situation can be illustrated as RF signals travelling through two different paths, a and b. It can be shown easily that the transfer characteristic of this type of circuit has very little frequency dependence, and yields an excellent broadband circuit. However, a sharp cut-off characteristic is difficult to achieve.

Conventional transversal filters are designed with frequency dependent phase delays, $t_a$ and $t_b$, which produce overall frequency-selective power combining characteristics. The output port is at the same side as the input port. The principle of operation is discussed in the following. It should be noted that this circuit requires large delay sections in order to create the frequency selectivity which is necessary for the filter design. The size of these delay sections thus diminishes the desirability of monolithic integration. It should also be noted that the principle of this circuit is a low pass filter with spurious passbands at higher frequencies.

Let's consider two signal paths, a and b. Gate voltages $V_1$ and $V_2$ at FET 1 and 2 have a phase difference of $t_a$, let $V_o$ represent a voltage as;

$$V_1 = V_0, \; V_2 = V_0 exp(-jt_a), \quad \text{Eq. 2}$$

Currents, $I_1$ and $I_2$, generated by these FETs are;

$$I_1 = G_{m1} V_0, \; I_2 = G_{m2} V_0 exp(-jt_a), \quad \text{Eq. 3}$$

where $G_{m1}$ and $G_{m2}$ are the transconductance of the FETs.

If the circuit is designed so that each FET will see a load matched to the FET's interval resistance $R_{di}$ (i=1,2), voltage, $V_{out}$, at the output port is;

$$V_{out} = 0.5 I_1 R_{d1} = 0.5 I_2 R_{d2} exp(-jt_b) \quad \text{Eq. 4}$$

Current, $I_{out}$, at the output port is the sum of the currents in Equation 3 with the phase shift along the drain line, and can be shown as;

$$I_{out} = 0.5 G_{m1} V_0 + 0.5 G_{m2} V_0 exp(-j(t_a + t_b)) \quad \text{Eq. 5}$$

As can be seen in Eqs. 4 and 5, power from two FETs can be combined at the output port, only at the frequencies that satisfy, $$t_a + t_b = 2n\pi (n=0, 1, \ldots) \quad \text{Eq. 6}$$

At this radian frequency, $\omega_0$, the circuit will present an admittance of;

$$1/R_{d1} + 1/R_{d2} \quad \text{Eq. 7}$$

which the circuit must be designed with as the load admittance $Y_L (= R_L)$.

Output power, $P_{out}$, of this circuit can be obtained by;

$$P_{out}\left[\frac{\omega}{\omega_0}\right] = Y_L I_{out} I_{out}^* = \quad \text{Eq. 8}$$

$$0.25 \; Y_L V_0^2 \left[ G_{m1}^2 + G_{m2}^2 + 2 G_{m1} G_{m2} \cos\left[2\pi \frac{\omega}{\omega_0}\right]\right]$$

where $I^*_{out}$ is the complex conjugate of $I_{out}$

Equation 8 is graphically illustrated in FIG. 11, in the case when $G_{m1} = G_{m2}$. It shows single pole passband characteristics at radian frequencies, $\omega = 0, \omega_0, 2\omega_0, 3\omega_0 \ldots$ It should be noted that this topology provides a low pass filter characteristic.

Now, if multiple signal paths are added to the transversal filter, it can be shown that the output power of the circuit can be reduced to;

$$P_{out}\left[\frac{\omega}{\omega_0}\right] = 0.5\, Y_1 V_0^2 G_{m1}^2 \left[ a_0 + \sum_{i=1}^{M} a_i \cos\left[ 2\pi i \frac{\omega}{\omega_0} \right] \right] \quad \text{Eq. 9}$$

where $a_i$ (i=0, 1 ... M) are weighting factors determined by the FET size of the corresponding path.

By choosing this weighting function appropriately, various passband characteristics can be designed.

It should be noted again that the condition given by Eq. 6 requires fairly long delay line sections or a large number of lumped element components which are not easily achievable in monolithic form. Other variations of transversal filters can be found in the literature, but the basic requirements do not change; the long delay line sections to achieve frequency selectivity.

A transversal filter of the present invention includes lumped element low pass, high pass, and/or bandpass input and output lines having band edges or cutoff frequencies corresponding to that of the filter. For example a bandpass filter could include both low pass (phase delay) and high pass (phase advance) lines. With opposite phase shifts, when combined the lines provide a strong frequency dependent behavior requiring a relatively small number of elements to provide steep frequency slopes. The circuit now has a bandpass characteristic rather than the low pass characteristic of conventional transversal filters.

A phase delay line is an ordinary piece of transmission line and a phase advance line is a piece of a transmission line of negative length. To study the principle of the for circuit simulation.

Both lines can be simulated by a lumped element ladder circuit using Ls and Cs. By exchanging the position of Cs and Ls of phase delay line, a phase advance line is provided and if the same values for Cs and Ls are used, the line impedance is identical and the propagation constant is the reverse of the other with opposite sign.

The transmission power of a circuit where phase delay is used for the input line while phase advance is used for the output line. Similar equations can be used to describe the case where only two signal paths exist, but instead of Eq. 2, one would get;

$$I_{out} = 0.5 G_{m1} V_0 + 0.5 G_{m2} V_0 \exp(-j(t_a - t_b)) \quad \text{Eq. 10}$$

Now if these delay and advance lines are made of lumped element components, then;

$$t_a - t_b = \sqrt{t_{a0} t_{b0}} \left[\frac{\omega}{\omega_0} - \frac{\omega_0}{\omega}\right] \text{ or } \sqrt{t_{a0} t_{b0}}\, S \quad \text{Eq. 11}$$

where $$\omega_0 = 1/\sqrt{LC},\ S = \left[\frac{\omega}{\omega_0} - \frac{\omega_0}{\omega}\right]. \quad \text{Eq. 12}$$

and $t_{a0}$, $t_{b0}$ are phase shifts $t_a$ and $t_b$ at $\omega = \omega_0$.

The condition for the maximum power is, from Eq. 10, when;

$$t_a - t_b = 2n\pi\, (n=0, \pm 1, \pm 2 \ldots) \quad \text{Eq. 13}$$

Thus, the primary passband is when n=0, which is at $\omega = \omega_0$ or S=0, but not at $\omega = 0$. This makes this circuit a bandpass rather than a low pass circuit.

By using this expression, Eq. 10 is now;

$$I_{out} = 0.5\, G_{m1} V_0 + 0.5\, G_{m2} V_0 \exp(-j \sqrt{t_{a0} t_{b0}}\, S) \quad \text{Eq. 14}$$

The output power of this circuit may be derived as;

$$P_{out} = 0.25\, Y_L V_0^2 [G_{m1}^2 + G_{m2}^2 + 2 G_{m1} G_{m2} \cos[\sqrt{t_{a0} t_{b0}}\, S]] \quad \text{Eq. 15}$$

The output power performance defined by this equation has a similar single pole curve as the previous circuit but does not have a passband at $\omega = 0$. The power response with multipaths is now;

$$P_{out}[S] = 5\, Y_L V_0^2 G_m^2 \left[ a_0 + \sum_{i=1}^{M} a_i \cos[i \sqrt{t_{a0} t_{b0}}\, S] \right] \quad \text{Eq. 16}$$

The transfer function of this circuit is;

$$H_T[j\omega] = \sum_{m=0}^{M} \alpha_m \exp -j \sqrt{t_{a0} t_{b0}}\, ms$$

where $\infty_m$ is the attenuation constant of the $m^{th}$ signal path;

Its response curve can be designed to any classical filter characteristics such as Tchebyschev or Maximally flat, by choosing $a_i$, as before.

Figure 10:
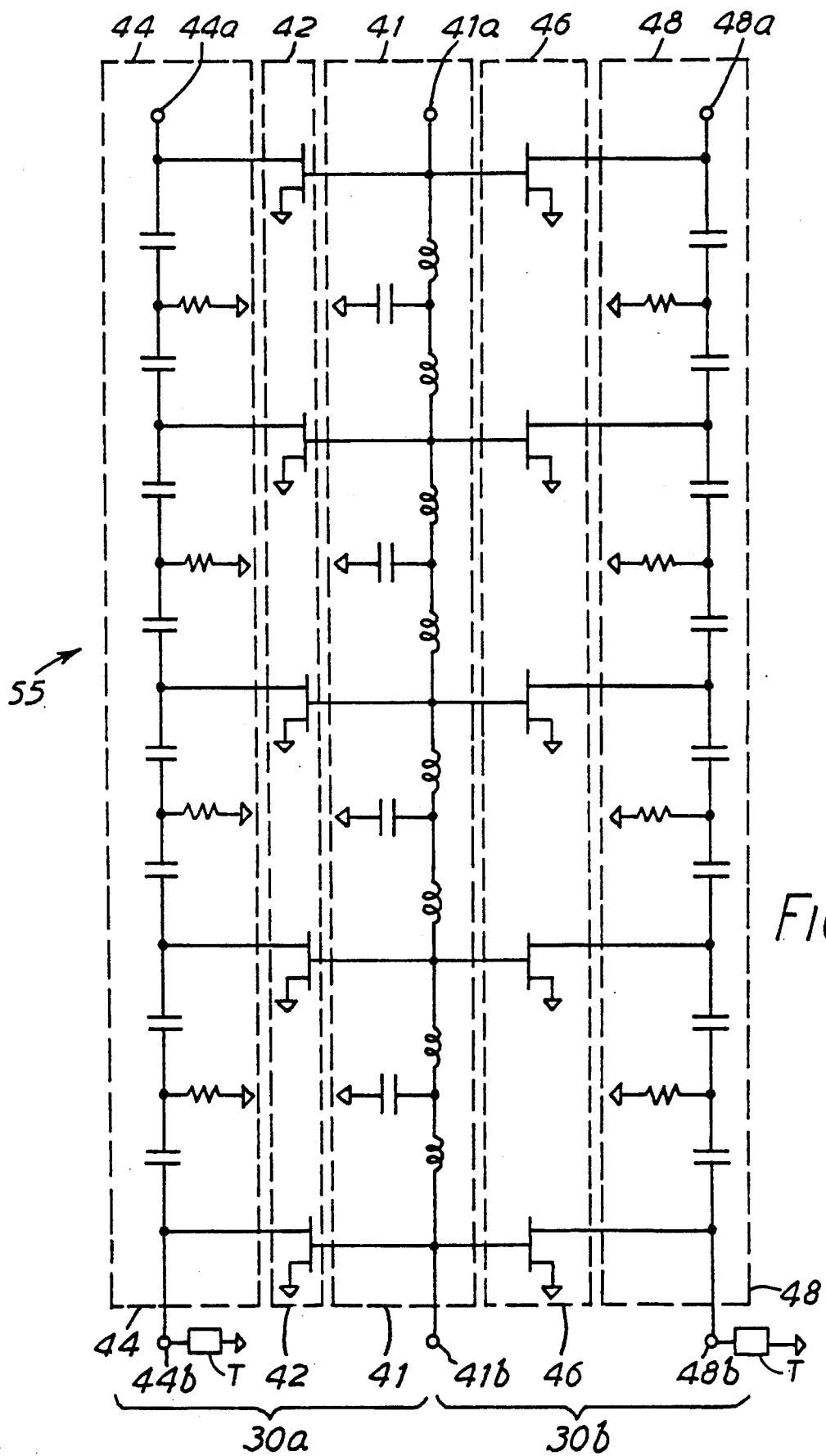
FIG. 10 is a schematic diagram of a diplexer in accordance with a further aspect of the present invention.

A generalized topology of a recursive filter as illustrated in FIG. 10 includes a mix of feed forward paths and feed back paths. The transfer function of a circuit with M+1 feed forward paths and N feed back paths can be written in the form;

$$H_R(j\omega) = \frac{\sum_{m=0}^{m} \alpha_m \exp(-j 2\pi m \omega / \omega_o)}{1 + \sum_{n=1}^{n} \beta_n \exp(-j 2\pi n \omega / \omega_o)} \quad \text{Eq. 18}$$

where $\beta_n$ is the phase constant of the $n^{th}$ signal path.

Again, the use of delay and advance line sections will provide a compact version of this circuit. Multiple active elements and feedback paths should improve the cut-off characteristics also.

As indicated above, the position of the output port in FIG. 5 can be brought to the other end of the output line (as shown in FIG. 8) and the circuit can be designed to combine the output power from the FETs at the output port in a travelling-wave manner. The configuration is similar to the conventional travelling wave amplifier because, in the passband, the power is added in phase at the output port in a similar manner. However, the power is rejected outside the band due to the difference of frequency sensitivity of phase shift between the input and output lines.

A power response equation similar to Eq. 16 can be derived for this circuit, indicating the same filtering function is possible. The circuit has lumped element phase delay lines in the input line and lumped element phase advance lines in the output lines.

The spurious passbands are also suppressed with this topology. This is explained as follows. Lumped element expression of a transmission line, both delay and advance, is not allowed near the cut-off frequency. The lumped circuit expression of a delay line in FIGS. 2-3 represents a low pass filter and beyond the cut-off frequency, the characteristic impedance of the line becomes imaginary and wave propagation stops. This does not occur with the transmission line model. Similarly, the lumped circuit for the phase advance line is a high pass filter and wave propagation stops below the cut-off frequency. The cut-off frequency of these lumped element artificial transmission lines are;

$$\omega_C = \frac{2\pi}{LC}$$

This cut-off characteristic of artificial lines is effective in suppressing spurious passbands. It is also found that the travelling wave topology takes maximum advantage of this characteristic.

Figure 12:
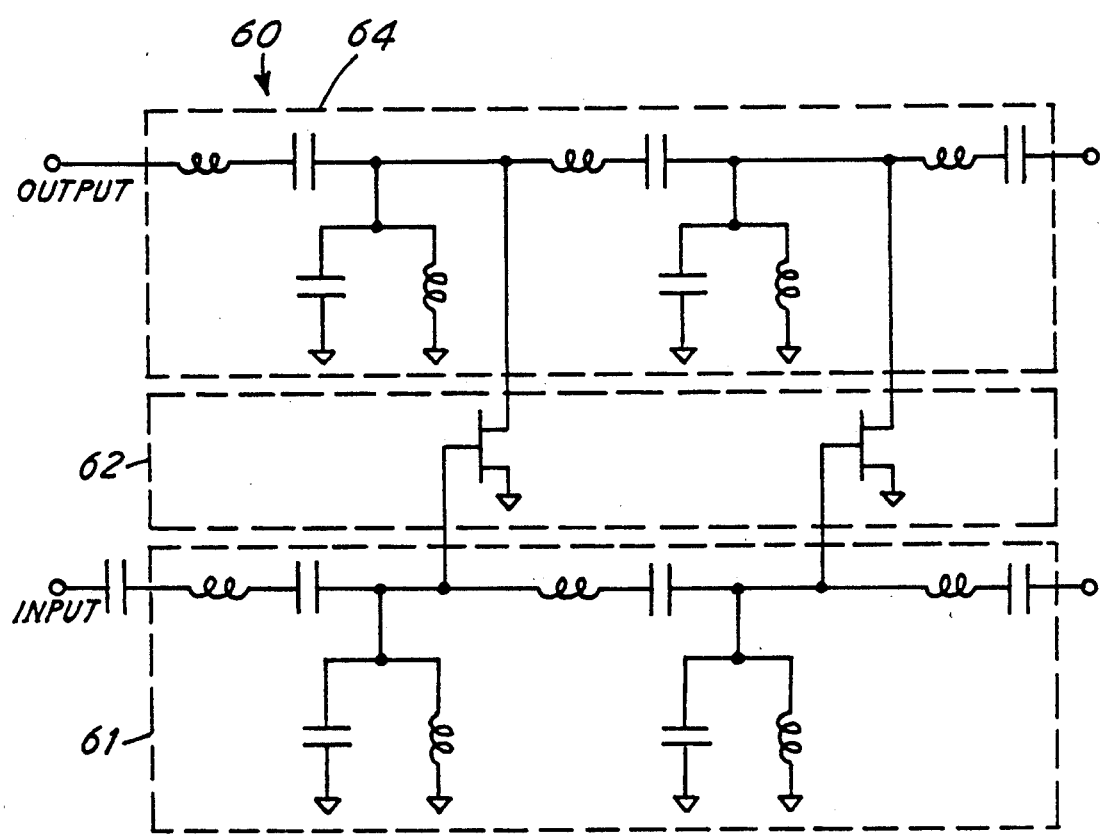
FIG. 12 is a schematic diagram of a transversal filter having bandpass characteristic for input and output lines.

Referring now to FIG. 12, a transversal filter 60, having input and output propagation media 61 and 64 provided as lumped element lines L's and C's having a bandpass characteristic and coupled by transversal elements 62, is shown. Each of the lines 61, 64 has frequency skirts or cutoff frequencies corresponding to those of the transversal filter 60 to provide such a filter having very sharp frequency roll-off at the band edges with a mininum number of transversal elements, as with the other embodiments described above.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:
1. A filter having an input terminal and an output terminal, and a frequency response characteristic comprising:
an input propagation network having a first response which is a first one of a low pass frequency response, a high pass frequency response, and a band pass frequency response and having a first end thereof connected to the input terminal;
an output propagation network having a second response which is a second one of a low pass frequency response, a high pass frequency response, and a band pass frequency response and having a first end thereof coupled to the output terminal;
weighting means, coupled between said input and output propagation network, for providing at least one weighted signal path from said input propagation network to said output propagation network, to adjust the frequency response to the filter; and
wherein at least one of said first and second responses has a cutoff frequency characteristic which coincides with the frequency response of the filter.

2. The filter of claim 1 wherein said weighting means comprise at least one transversal element and at least one of said propagation networks is a phase advance network.

3. The filter of claim 1 wherein said weighting means comprises a plurality of transversal elements coupled between said input propagation network and said output propagation network, to provide a plurality of weighted amplitude signal paths and wherein said plurality of weighted signal paths provide, in combination with the cut off frequency responses of the input and output propagation networks, the frequency response of the filter.

4. The filter as recited in claim 2 wherein the transversal elements are field effect transistors, each field effect transistor having gate, drain, and source electrodes, with the gate electrode coupled to the input propagation network, the drain electrode coupled to the output propagation network, and the source electrode coupled to a common r.f. and d.c. potential.

5. The filter as recited in claim 4 wherein each one of the gate electrodes of each of the field effect transistors has a gate length for providing the weighted signal path.

6. The filter as recited in claim 4 wherein each one of said gate electrodes of each field effect transistor has a gate length and at least one of said field effect transistors has disposed at the gate electrode at least one capacitor which provides a voltage divider, to provide in combination therewith weighted signal paths through the transistors.

7. The filter as recited in claim 6 wherein each one of the propagation networks are comprised of a plurality of lumped element inductors and capacitors connected together with said lumped element inductors being comprised of sections of microstrip transmission line, and with said propagation networks including at least one phase advance network including said capacitors as serial elements of said phase advance and said sections of microstrip transmission line disposed as shunt elements between said capacitors and a reference potential.

8. The filter as recited in claim 6 wherein each one of the propagation networks are comprised of a plurality of lumped element inductors and capacitors connected together with the lumped element inductors being lumped spiral inductor elements and with said propagation networks including at least one phase advance network including said capacitors as serial elements of said phase advance network and said lumped spiral inductor elements disposed as shunt elements between said capacitors and a reference potential.

9. The filter as recited in claim 3 wherein at least one of the plurality of weighting means is a recursive element connected between the input propagation network and the output propagation network for providing a signal path from said output propagation network to the input propagation network.

10. The filter as recited in claim 9 wherein the recursive element is a resistor.

11. The filter element as recited in claim 10 wherein the transversal elements are field effect transistors, each field effect transistor having gate, drain, and source electrodes, with the gate electrodes connected to the input propagation network, the drain electrodes connected to the output propagation network, and the source electrodes connected to a common r.f. and d.c. reference potential.

12. The filter as recited in claim 11 wherein the field effect transistors which provide the transversal elements have gate electrode lengths to provide weighted signal paths therethrough, and wherein the recursive element has a value of resistance to provide a weighted signal path therethrough.

13. The filter as recited in claim 12 wherein the transversal elements are field effect transistors having gate lengths and further comprise:
capacitance voltage dividers at the gate electrode of at least one of said field effect transistors to provide weighted signal paths therethrough, and the recursive element is a resistor having a value of resistance to provide a weighted signal path therethrough.

14. A filter comprising:
a phase delay line connected to a first one of an input terminal and output terminal of said filter;
a phase advance line connected to a second different one of the input terminal and output terminal of said filter; and
weighting means, coupled between said phase advance and phase delay lines, for providing at least one weighted signal path between said phase delay line and said phase advance line.

15. The filter of claim 14 wherein said weighting means provides a plurality of weighted amplitude factors.

16. The filter of claim 15 wherein said weighting means are successively connected along said phase delay line and phase advance line.

17. The filter of claim 16 wherein said weighting means comprises a plurality of field effect transistors coupled between said phase delay line and said phase advance line to provide the plurality of weighted signal paths, each transistor including source, drain, and gate electrodes with each transistor having a gate electrode length to provide the weighted signal path.

18. The filter of claim 17 wherein the phase advance line comprises a plurality of lumped elements including capacitors disposed as serial elements of the line connected together with inductors, said inductors disposed in shunt between said capacitors and a reference potential.

19. The filter of claim 14 wherein said weighting means comprises a plurality of field effect transistors coupled between the phase delay line and phase advance line to provide a plurality of weighted signal paths, with each transistor having source, drain, and gate electrodes with each transistor further having a gate electrode length to provide each weighted signal path.

20. The filter of claim 19 wherein the weighting means includes at least one recursive element, comprised of a resistor connected between said phase advance line and said phase delay line.

21. A transversal filter, having an input terminal and output terminal, comprising:
means, coupled to a first one of said input and output terminals, for providing phase advance to a propagating signal fed thereto;
means, coupled to a second, different one of said input and output terminals, for providing phase delay to a propagating signal fed thereto; and
weighting means for providing a plurality of weighted amplitude signal portions, said weighting means coupled to the one of said phase advance means and phase delay means coupled to the input terminal, and said weighting means coupled to and for feeding said weighted amplitude signal portions to the one of said phase advance and phase delay means coupled to the output terminal.

22. The transversal filter as recited in claim 21 wherein said means for providing phase advance comprises a lumped element network having a plurality of series connected capacitors connected together with shunt coupled inductors and said means for providing phase delay comprises a plurality of series connected inductors connected together with shunt coupled capacitors.

23. The transversal filter as recited in claim 22 wherein said weighting means includes a plurality of field effect transistors, each field effect transistor having gate, drain and source electrodes with said gate electrodes being coupled to an input one of said phase advance means and phase delay means and said drain electrodes being coupled to an output one of said phase advance and phase delay means.

24. A diplexer having an input terminal, first and second output terminals and a pair of frequency responses, comprising:
an input propagation network having a first one of a low pass frequency response, a high pass frequency response, and a bandpass frequency response characteristic and having a first end coupled to the input terminal of the diplexer;
a first output propagation network having a second one of a low pass frequency response, a high pass frequency response, and a bandpass frequency response and having a first end connected to the first output of the diplexer;
a second output propagation network having a third one of a low pass frequency response, a high pass frequency response, and a band pass frequency response and having a first end coupled to the second output terminal of the diplexer;
first weighting means coupled between said input propagation network and said first output propagation network for providing at least one weighted signal path between said input propagation network and said first output propagation network;
second weighting means coupled between said input propagation network and said second output propagation network for providing at least one weighted signal path between said input propagation network and said second output propagation network; and
wherein at least one of said input propagation network and said pair of output propagation networks has a rolloff frequency characteristic which coincides with a rolloff frequency characteristic of one of said pair of frequency responses of the diplexer.

25. The diplexer as recited in claim 24 wherein each of said weighting means comprises a transversal element.

26. The diplexer as recited in claim 24 wherein each weighting means comprises a plurality of transversal elements coupled between said input propagation network and a respective one of said output propagation network.

27. The diplexer as recited in claim 26 wherein the plurality of transversal elements of each weighting means are field effect transistors, each field effect transistor having gate, drain, and source electrodes, with the gate electrode connected to the input propagation network, and the drain electrodes connected to a respective one of the output propagation network.

* * * * *